United States Patent [19]

Fukasawa et al.

[11] Patent Number: 4,871,110
[45] Date of Patent: Oct. 3, 1989

[54] METHOD AND APPARATUS FOR ALIGNING SOLDER BALLS

[75] Inventors: Hideyuki Fukasawa; Mamoru Kobayashi; Masahiro Wanami, all of Hadano, Japan

[73] Assignee: Hitachi, Ltd., Tokyo, Japan

[21] Appl. No.: 224,355

[22] Filed: Jul. 26, 1988

[30] Foreign Application Priority Data

Sep. 14, 1987 [JP] Japan .................................. 62-230406

[51] Int. Cl.⁴ .............................................. B23K 3/06
[52] U.S. Cl. ...................................... 228/245; 228/41; 269/903; 269/21
[58] Field of Search ...................... 228/123, 180.2, 221, 228/245, 56.3, 33, 41; 269/903, 21

[56] References Cited

U.S. PATENT DOCUMENTS

| | | | |
|---|---|---|---|
| 3,320,658 | 5/1967 | Bolda et al. | 228/246 |
| 3,355,078 | 11/1967 | Smith | 269/21 |
| 4,209,893 | 7/1980 | Dyce et al. | 228/56.3 |
| 4,462,534 | 7/1984 | Bittaillou et al. | 228/246 |

FOREIGN PATENT DOCUMENTS

| | | | |
|---|---|---|---|
| 86679 | 6/1980 | Japan | 228/245 |
| 72663 | 4/1985 | Japan | 228/246 |
| 242759 | 10/1986 | Japan | 228/245 |

OTHER PUBLICATIONS

IBM Technical Disclosure Bulletin, "Release Method For Solder Ball Placement", vol. 30, No. 4, p. 1755, Sep. 1987.

Primary Examiner—Richard K. Seidel
Assistant Examiner—Samuel M. Heinrich
Attorney, Agent, or Firm—Fay, Sharpe, Beall, Fagan, Minnich & McKee

[57] ABSTRACT

Solder balls are supplied onto an aligning plate having aligned through-holes formed therein. Air is sucked from the bottom of the above described aligning plate to fit and attract solder balls into the above described through-holes. Solder balls are thus aligned with high work efficiency.

10 Claims, 2 Drawing Sheets

METHOD AND APPARATUS FOR ALIGNING SOLDER BALLS

BACKGROUND OF THE INVENTION

The present invention relates to a method for aligning solder balls, and in particular to a method for aligning and sticking solder balls onto the electrodes of a semiconductor chip or connection pads of a circuit substrate before soldering.

In a known method, a semiconductor chip is mounted on a circuit substrate, and solder balls are heated and melted to couple the electrodes of the semiconductor chip with connection pads of the circuit substrate electrically and mechanically. In implementing this method, it becomes necessary to align and stick the solder balls onto the electrodes of the semiconductor chip or connection pads of the circuit substrate.

Such alignment of solder balls has heretofore been performed as follows. First of all, a mask having a number of holes corresponding to aligned positions of the solder balls is placed on the electrode face of the semiconductor chip or the component mounting face of the circuit substrate, and solder balls are supplied onto the mask. Under this state, the mask is vibrated to put solder balls into holes of the mask, or solder balls are put into holes manually one by one by using a tool such as a vacuum pincette or a brush. Thereafter extra solder balls existing on the mask are removed by using a brush, for example.

Such a method is described in JP-A-58-35935, for example.

SUMMARY OF THE INVENTION

In the above described prior art, solder balls might adhere to each other and to a tool such as a brush because of static electricity. Therefore, the solder balls might not easily get into the holes of the mask and, once aligned, might jump out from the holes when extra solder balls on the mask are removed. This results in a problem of extremely low work efficiency.

An object of the present invention is to provide an efficient method for aligning solder balls that overcomes the above described problem.

The above described object is achieved by supplying solder balls on an aligning plate having aligned through-holes formed therein and sucking air from the bottom of the aligning plate to make the solder balls fit into and adhere to the through-holes.

Since solder balls supplied onto the aligning plate are attracted into the through-holes of the aligning plate by air, it is possible to align the solder balls on the aligning plate sufficiently without being affected by static electricity. Once the solder balls are attracted into the through-holes of the aligning plate and are aligned, they do not jump out from the through-holes when extra solder balls are removed by a brush or the like. Therefore, efficient aligning work becomes possible.

BRIEF DESCRIPTION OF THE DRAWINGS

FIG. 1 is a sectional view showing solder balls aligned by air suction.

FIG. 2 is a sectional view showing work of removing extra balls.

DESCRIPTION OF THE PREFERRED EMBODIMENTS

An embodiment of the present invention will now be described by referring to FIGS. 1 and 2.

Figure 1:
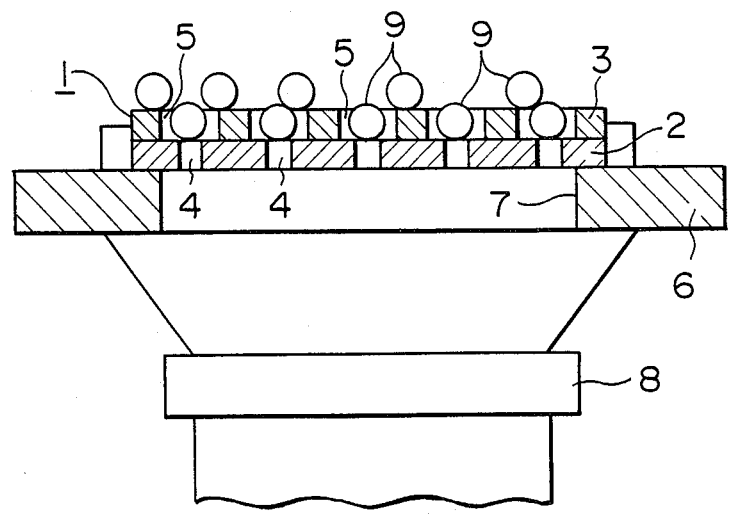
FIGS. 1 and 2 are rough sectional views used for explaining an embodiment of the present invention.
Figure 2:
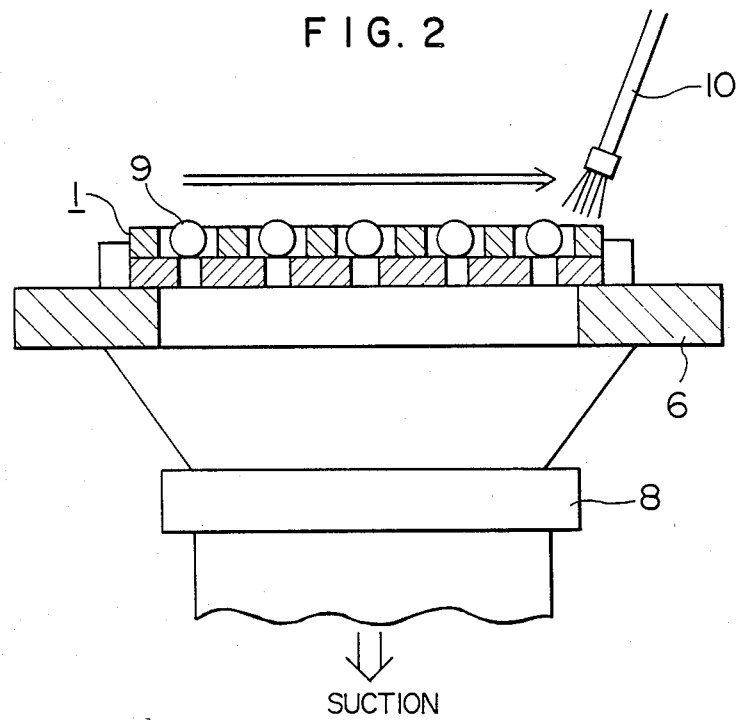

In FIGS. 1 and 2, numeral 1 denotes an alignment plate, which is formed by sticking two plates, i.e., a lower plate 2 and an upper plate 3 together. The material of the plates 2 and 3 is glass or ceramics, for example. In case of glass, photosensitive glass has excellent working performance, heat-resistance and adaptability in the rate of expansion with semiconductor chips, for example, and is therefore often used.

In the lower plate 2, through-holes 4 having smaller diameters than the outer diameters of the solder balls to be aligned are opened at positions corresponding to alignment positions. In the upper plate 3, through-holes 5 having slightly larger diameters than the outside diameters of the solder balls are open at positions corresponding to the through-holes 4.

Numeral 6 denotes an aligning plate fixing block for fixing the aligning plate 1. An air suction nozzle 8 is coupled to the aligning plate fixing block 6 so as to face an opening 7 of the aligning plate fixing block. The air suction nozzle 8 is connected to a vacuum pump or the like, which is not illustrated, via a tube or the like.

When solder balls are to be aligned, the aligning plate 1 is fixed to the aligning plate fixing block 6 and the solder balls 9 are supplied onto the aligning plate 1.

Air suction using nozzle 8 is then started. Since air on the surface of the aligning plate 1 is pulled down via the through-holes 4 and 5, solder balls 9 located near through-holes 5 are attracted into the through-holes together with air and eventually are attracted and held there by being fitted into the through-holes 5. That is to say, the through-holes 5 serve as guide holes for attracting solder balls 9, while the lower throughholes 4 actually position and attract the solder balls.

After solder balls 9 are aligned at all of the through-hole positions, the surface of the aligning plate 1 is swept by a brush 10 as shown in FIG. 2, for example, to remove extra solder balls existing on the aligning plate 1. Since the solder balls that are already aligned are held in the through-holes 4 by the air suction during this work, they do not jump out from the through-holes 4. The fact that only the upper portion of the aligned solder balls protrudes slightly above the surface of the aligning plate 1 and the remaining portions of the aligned solder balls is within the through-holes 5 is also effective in preventing the escape of the solder balls that are already aligned.

After such work has been performed, the air suction is stopped, and the aligning plate 1 for aligning the solder balls is removed from the aligning plate fixing block 6. The work for aligning the solder balls is thus completed.

If a shock is applied to the aligning plate 1 or the aligning plate 1 is tilted during the work of removing the aligning plate fixing block or thereafter, there is a possibility that solder balls slip out from the through-holes 4. Since the solder balls are held in the through-holes 5, however, the solder balls easily return to the through-holes 4.

Figure 3:
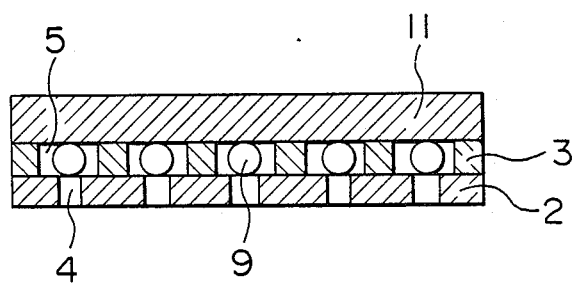
FIG. 3 shows a semiconductor chip placed on an aligning plate.

After the work of aligning the solder balls has been finished, the aligning plates 2 and 3 are removed from the aligning plate fixing block 6, and a circuit substrate 11 is placed on the aligning plates 2 and 3 to perform soldering work, as shown in FIG. 3.

Although an embodiment has heretofore been described, the present invention may be modified in accordance with other practical considerations without departing from the scope of the invention.

For example, solder balls are supplied onto the aligning plate before the air suction is applied in the above described embodiment. However, the solder balls may be supplied onto the aligning plate while the air suction is being performed. Also, the structure of the aligning plate may be changed suitably. For example, two plates of the aligning plate 1, i.e., the lower plate 2 and the upper plate 3 may be formed as one body.

Further, the method of the present invention is similarly applicable to the alignment of small balls other than solder balls.

As evident from the foregoing description, the present invention brings about an effect that solder balls can be aligned easily and efficiently.

We claim:

1. A method for aligning solder balls having an outer diameter comprising the steps of:
   supplying solder balls onto an aligning plate having through-holes formed therein, each of said through-holes having a first hole and a second hole connected to said first hole, said first hole having a slightly larger diameter than the outer diameter of the solder ball to be aligned and being open to one surface of said aligning plate, and said second hole having a diameter smaller than the outer diameter of the solder ball and being open to another surface of said aligning plate;
   applying a vacuum from said another surface of said aligning plate through said through-holes;
   attracting and fitting solder balls existing on said aligning plate into said first holes with said vaccum; and
   positioning and attracting solder balls into said second holes.

2. A method for aligning solder balls according to claim 1, wherein said supplying includes providing said aligning plate of a glass material.

3. A method for aligning solder balls according to claim 1, wherein said supplying includes providing said aligning plate of a photosensitive glass material.

4. A method for aligning solder balls according to claim 1, wherein said supplying includes providing said aligning plate of a ceramics material.

5. The method of aligning solder balls of claim 14, further comprising the step of:
   supplying an excess number of solder balls so that aligned ones of the solder balls are positioned in said second holes and excess ones of the solder balls are positioned outside the first holes, and removing the excess solder balls from said aligning plate by moving the excess solder balls across said one surface of the aligning plate without disturbing the positioning of the aligned ones of the solder balls.

6. The method for aligning solder balls of claim 5, wherein said step of removing the excess solder balls includes maintaining said vacuum applying step during said removing step.

7. An apparatus for aligning solder balls, comprising
   an aligning plate having aligned through-holes formed therein for aligning solder balls supplied on said aligning plate;
   an aligning plate fixing block for fixing said aligning plate;
   an air suction nozzle coupled to said aligning plate fixing block;
   said aligning plate including a lower plate and an upper plate;
   first through-holes having a smaller diameter than an outer diameter of solder balls to be aligned, said first through holes being open at posiitons of said lower plate corresponding to alignment posiitons; and
   second through-holes having a diameter larger than an outer diameter of solder balls to be aligned, said second through-holes being open at positions of said upper plate corresponding to said first through-holes in said lower plate.

8. An apparatus for aligning solder balls according to claim 7, wherein the lower plate and the upper plate comprise glass.

9. An apparatus for aligning solder balls according to claim 7, wherein the lower plate and the upper plate comprise photosensitive glass.

10. An apparatus for aligning solder balls according to claim 7, wherein the lower plate and the upper plate comprise ceramics.

* * * * *